United States Patent [19]

Thomson

[11] 4,307,347
[45] Dec. 22, 1981

[54] ENVELOPE DETECTOR USING BALANCED MIXER

[75] Inventor: Don N. Thomson, Haddonfield, N.J.

[73] Assignee: RCA Corporation, New York, N.Y.

[21] Appl. No.: 52,732

[22] Filed: Jun. 28, 1979

[51] Int. Cl.³ .............................................. H03D 1/10
[52] U.S. Cl. ..................................... 329/50; 329/164; 329/192; 329/204; 329/206
[58] Field of Search ............... 329/105, 163, 164, 192, 329/203, 204, 205 R, 206, 50, 101, 109; 455/201–204, 337

[56] References Cited

U.S. PATENT DOCUMENTS

| | | | |
|---|---|---|---|
| 2,227,902 | 1/1941 | Hähnle | 455/201 |
| 2,797,314 | 6/1957 | Eglin | 455/204 |
| 2,828,414 | 3/1958 | Rieke | 455/204 |
| 2,881,312 | 4/1959 | Ressler | 329/204 X |
| 3,697,685 | 10/1972 | Lunn | 329/101 X |
| 3,796,963 | 3/1974 | Balaban | 329/101 |
| 3,921,073 | 11/1975 | Pexa | 455/47 |
| 4,163,196 | 7/1979 | Hongu et al. | 329/101 X |

Primary Examiner—Siegfried H. Grimm
Attorney, Agent, or Firm—Samuel Cohen; Robert L. Troike; Donald W. Phillion

[57] ABSTRACT

An envelope detector with an extended linear dynamic range. A first amplitude modulated carrier signal, which can be of an intermediate frequency, is supplied to a first input terminal of a mixer, preferably balanced. The said first signal is also amplified and limited to produce a second signal which is phase synchronized with the carrier signal of said first signal, and which is supplied to the local oscillator input terminal of the mixer. The mixer responds to said first and second signals to produce a substantially dc (baseband) output signal whose waveform is similar to the envelope of said first signal.

3 Claims, 4 Drawing Figures

ENVELOPE DETECTOR USING BALANCED MIXER

This invention relates generally to signal envelope detectors and more specifically, to an envelope detector with an extended dynamic range for use particularly, but not exclusively, at intermediate frequencies.

Conventional envelope detectors for intermediate frequencies (IF) usually consist of one or more diodes followed by a low pass filter to remove the IF frequency and the harmonics thereof. The minimum output voltage is determined by the knee or threshold voltage of the diode I-V curve. Maximum voltage is usually restricted by the power supply of the amplifier driving the detector. Typically, the minimum output voltage is about 0.3 volts and the maximum voltage is of the order of 10 volts. This provides a dynamic range of 30 dB over which the output is relatively linear.

In some prior art circuits, the dynamic range has been substantially increased with the use of a balanced mixer which requires a reference signal of about 7 dBm whose phase and frequency are the same as the intermediate frequency of the received signal. Specifically, in cases where the received signal has a continuous wave (CW) carrier, it is possible to filter the carrier and use it as the local oscillator reference input to the balanced mixer to obtain a dynamic range from above 1 dBm to almost −50 dBm as compared with the above-mentioned 30 dB dynamic range without the use of a balanced mixer.

However, in some cases the frequency and phase of the received signal is not known and thus a reference signal cannot be generated locally. For example, the pulsed signals associated with radar are received with their phases varying randomly from pulse to pulse so that the use of a balanced mixer to increase the dynamic range of the envelope detector cannot be employed with prior art methods and structures.

In accordance with a preferred form of the invention, the signal whose envelope is to be detected is supplied to one input of a mixer. The same signal is also amplified and limited and then supplied to a second input of the mixer. The carrier frequency components of both signals, which can be IF frequencies, supplied to the mixer are in phase and are removed by the mixer to produce a dc or baseband output signal over a relatively wide linear range.

Figure 1:
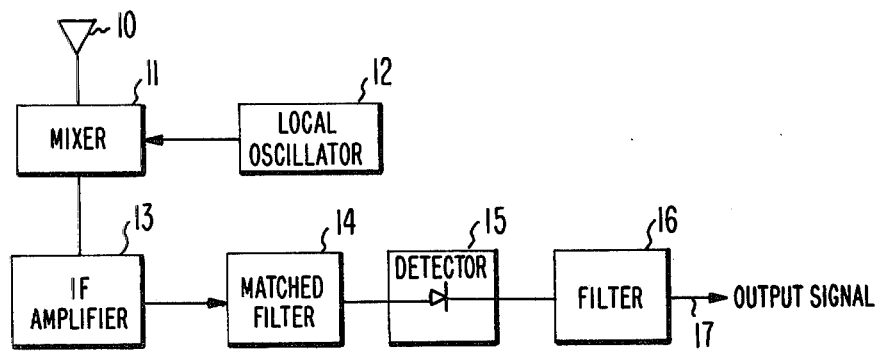
FIG. 1 is a block diagram of a typical prior art envelope detector.

In the prior art structure of FIG. 1, an incoming signal such as a returning radar pulse, is received by antenna 10 and supplied to a mixer 11 where the carrier frequency is heterodyned to an intermediate frequency by means of local oscillator 12. The IF signal is then amplified by amplifier 13 and supplied to a matched filter 14 to obtain the maximum signal-to-noise ratio. The output of matched filter 14 is supplied to an envelope detector 15, usually consisting of one or more diodes, which rectifies the IF carrier signal. The output of detector 15 then consists of the baseband modulation, the IF frequency, and its harmonics. This composite signal is supplied to filter 16 which removes the IF frequency, the higher order harmonics and high frequency noise. The filtered signal supplied to output terminal 17 is a dc pulse representing the received radar pulse.

With the prior art of FIG. 1, the maximum linear dynamic range obtainable for the received signal is approximately 30 dB. As indicated above, the minimum output voltage is about 0.3 volts and the maximum about 10 volts. The present invention decreases the minimum output limit of 0.3 volts to a substantially lower value whereby the linear dynamic range is increased to over 50 dB.

Figure 2:
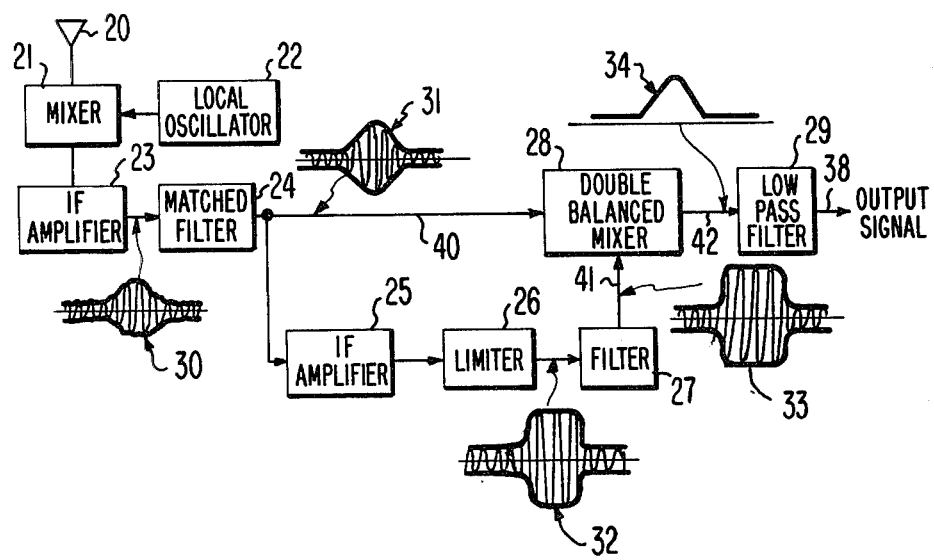
FIG. 2 is a block diagram of an envelope detector embodying the present invention with signal waveforms indicated at various points therein.

In FIG. 2, a reflected radar pulse is received by antenna 20 and heterodyned to an intermediate frequency by means of mixer 21 and local oscillator 22. The intermediate frequency signal is amplified by IF amplifier 23 and supplied to matched filter 24. The output of IF amplifier 23 is indicated by waveform 30 and contains considerable noise. The matched filter 24 functions to optimize the signal-to-noise ratio which, in fact, results in the triangularly-shaped envelope of waveform 31 which still retains the IF carrier frequency. The signal 31 is supplied via lead 40 directly to the double balanced mixer 28 and is also supplied to a second IF amplifier 25, where it is amplified to a much larger value than the output of matched filter 24. The output of IF amplifier 25 is supplied to limiter 26 which produces at its output the signal of waveform 32. It will be seen that waveform 32 has a flat plateau corresponding to the occurrence of the triangular portion of waveform 31. Further, the intermediate frequency component of the waveform 32 is a square wave due to the effect of limiter 26 and therefore contains harmonic components of higher frequencies. The signal 32 is supplied to filter 27 which produces an output signal 33 from which many of the higher order harmonics of the IF signal have been removed and which is more nearly sinusoidal in shape.

The signal 33 functions as a local oscillator signal which is supplied to a second input 41 of the double balanced mixer 28. The output of the double balanced mixer 28 is represented by waveform 34 which is a dc pulse and represents the received radar pulse. The waveform 34 is supplied to a low pass filter 29 to remove any higher order and unwanted frequencies remaining in the waveform 34 and produces on its output terminal 38 a clean pulse having the shape of waveform 34.

While a double balanced mixer is employed in FIG. 2, a single balanced mixer can also be employed with almost the same improved performance over prior art envelope detectors. Also, an unbalanced mixer can be employed.

Figure 3:
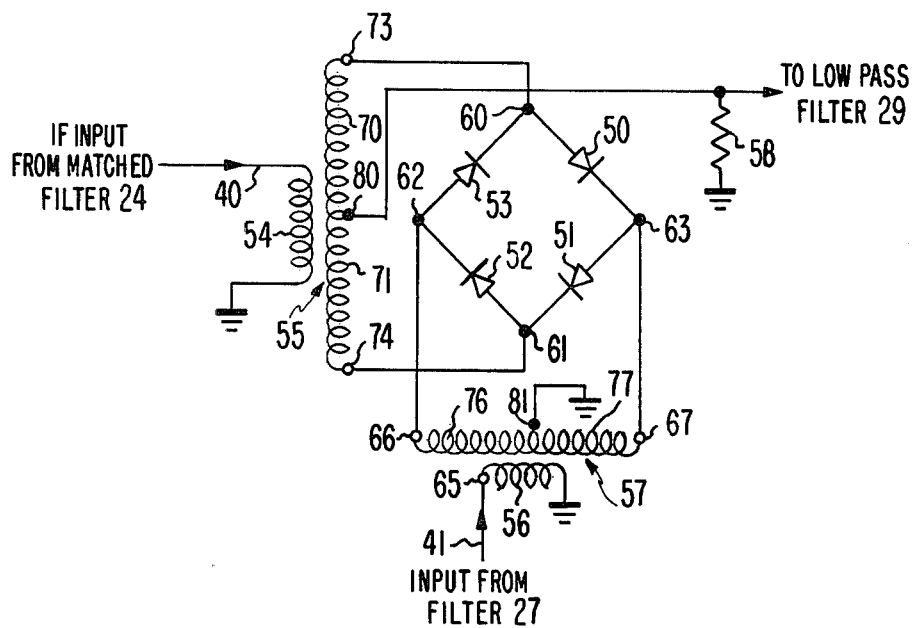
FIG. 3 is a schematic diagram of a double balanced mixer which can be employed in the circuit of FIG. 2.

A double balanced mixer suitable for employment in the invention is shown in FIG. 3 and operates in the following manner. The IF signal from the matched filter 24 is supplied via lead 40 to an input winding 54 of the double balanced mixer which is coupled inductively to a center tapped secondary winding 55, the end terminals 73 and 74 of which are connected to opposite terminals 60 and 61 of a diode bridge comprised of diodes 50, 51, 52 and 53. However, the IF signal is of insufficient amplitude to overcome the threshold voltage of any of the diodes 50 through 53. Therefore, in the absence of some other means of overcoming such threshold voltage of diodes 50-53, the IF signal will produce no output current through load resistor 58, since all current paths are blocked by the open circuited diodes 50-53.

However, consider the effect of the output of filter 27 and assume no input signal on lead 40. The output from filter 27 of FIG. 2 functions as a local oscillator whose frequency and phase are the same as the frequency and phase of the IF component of the signal supplied to the winding 54 from which the output signal of filter 27 is derived. The amplitude of such output signal from filter 27 is of sufficient magnitude to produce in center tapped secondary winding 57 voltages large enough to overcome the threshold voltage of diodes 50-53. Thus, when the terminal 65 of winding 56 becomes positive due to the supplying of waveform 33 of FIG. 3 thereto, the end terminal 66 of center tapped winding 57 will also become positive and the end terminal 67 of winding 57 will become negative, thereby flooding diodes 53 and 50 with current and making them conductive in both directions to input signals supplied to lead 40. Diodes 52 and 51 will be nonconductive so that no current will flow through the lower half 71 of winding 55.

Since the diodes 50-53 are carefully matched, the potential of point 60 will be at ground because of the ground center tap of winding 57. The opposite point 61 will also be at ground potential. Since point 60 is at ground potential, and resistor 58 is also grounded, there is no voltage across the upper half 70 of center tap winding 55 and no current will flow therethrough. Thus, the local oscillator input lead 41 is, in fact, isolated from the IF input lead 40. It is evident that no current flows from grounded point 60 through grounded resistor 58. Thus no voltage is produced across resistor 58, indicating that no IF input signal is present on lead 40.

Consider now the effect if at the same time that the end terminal 65 of winding 57 is positive, an IF signal is supplied to input 40 of primary winding 54 to cause end terminal 74 of secondary center tapped winding 55 to become positive and the other end terminal 73 to become negative. No current can flow from the point 74 through either of the two diodes 51 or 52 since such diodes are biased in their reverse direction by the negative voltage on end terminal 67 of winding 57. However, the center tap 80 of winding 55 is positive with respect to negative end terminal 73 and a current path can be traced through two paths from said center tap 80. The first path extends from center tap 80 through resistor 58 to ground and then in a return path from ground to center tap 81 of winding 57, the half portion 76 of winding 57, and then through conductive diode 53 to end terminal 73 of winding 55. The second current path also begins at center tap 80 of winding 55 and extends through resistor 58 to ground and then in the return path to the center tap 81 of winding 57, the portion 77 of winding 57, and through conductive diode 50 to the negative terminal 73 of winding 55.

In both paths, the current has created a positive voltage across resistor 58 which represents the output of the mixer.

Consider the case now where end terminal 67 of local oscillator secondary winding 57 becomes positive and the other end terminal 66 becomes negative. Under these conditions the two diodes 51 and 52 become conductive and diodes 50 and 53 are blocked by the reverse bias voltage.

Since the phase and frequency of the IF input signal on lead 40 is the same as the phase and frequency of the local oscillator input on lead 41, the end terminal 73 of secondary winding 55 will now be positive and the other end terminal 74 will be negative. No current can flow from end terminal 73 since both diodes 50 and 53 are nonconductive. However, the center tap 80 of winding 55 is positive with respect to end terminal 74 and current will flow therefrom through two paths as follows. The first path extends from point 80 through resistor 58 to ground and then in a return path to the center tap 81 of winding 57, the left-hand portion 76 of winding 57, the conductive diode 52 and back to the end terminal 74 of winding 55. The second path also begins at center tap 80 and extends through resistor 58 to ground and then to the center tap of 81 of winding 57, through the right-hand portion 77 thereof, and then through conductive diode 51 back to end terminal 74 of winding 55.

In all of the four current paths described above, the current passes through load resistor 58 to create a positive voltage thereacross. This positive voltage is represented by the waveform 34 of FIG. 2 and constitutes the output of double balanced mixer 28. The IF carrier has been removed in the mixer 28 leaving only the dc pulse of FIG. 2.

It is to be noted that in the absence of either the IF signal on input 40 or the local oscillator signal on input 41 there will be no output therefrom from mixer 28 of FIG. 2. The local oscillator signal by itself simply switches diodes 52 and 53 into states of conductivity and nonconductivity in alternate fashion. No current is generated through resistor 58. In the absence of a local oscillator signal supplied to lead 41, the IF signal supplied to input 40 will not produce a signal through load resistor 58 since all four diodes 50-53 are blocked.

Figure 4:
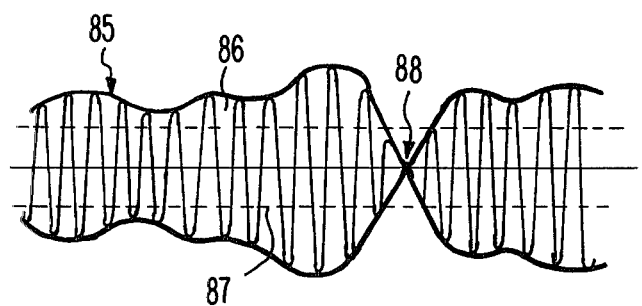
FIG. 4 shows a generalized amplitude modulated waveform whose envelope can be detected by the invention.

In FIG. 4 there is shown another more generalized signal waveform whose envelope can be detected by the circuit of FIG. 2. Assume that a signal having an envelope similar to that of signal 85, but before amplification thereof, is supplied from matched filter 24 to the balanced mixer 28. The same signal is amplified in IF amplifier 25 to form waveform 85 which is then limited to an amplitude indicated by dashed lines 86 and 87. Such limited signal is of constant amplitude and is supplied through filter 27 to input 41 of the double balanced mixer 28 as a local oscillator signal which functions in the manner described hereinbefore with respect to waveform 33.

Except for the portion 88 of the signal, the amplification of the signal in IF amplifier 25 is sufficient to exceed the cutoff value of limiter 26, thereby producing the nearly constant amplitude output signal from limiter 26. At point 88, however, the degree of amplitude modulation is almost 100% and the amplification in IF amplifier 25 is insufficient to amplify the signal to a value greater than the cutoff value to limiter 26. Therefore, during portion 88 of the signal there would occur a short interval of time when the diodes in the mixer 28 would not be switched to a conductive condition. During this small time period, no output signal would be supplied from balanced mixer 42. However, such occurrences in most cases would be infrequent with proper design of the circuit and would appear as transients in the output signal which could be removed by appropriate filtering. It should be noted that the circuit will function even though the phase of the carrier frequency of the signal of FIG. 3, or the phase of the signal of waveform 31 should vary from cycle to cycle inasmuch as the local oscillator output supplied to the balanced mixer 28 on input 41 is derived directly from the input signal and will have corresponding changes in phase.

What is claimed is:

1. Means for detecting the envelopes of a series of first amplitude modulated carrier signals of different frequencies or phases and comprising:

means for supplying said first amplitude modulated signals;

amplifying means responsive to said first amplitude modulated signals to produce a series of second signals each phase synchronized with the carrier signal from which it is derived;

limiting means responsive to said second signals to produce a series of third signals each phase synchronized with the carrier signal from which it is derived;

filtering means responsive to said series of third signals to remove the high frequency components introduced therein by the limiting action of said limiting means to produce a series of fourth signals each phase synchronized with the carrier signal from which it is derived; and mixer means responsive to said first amplitude modulated signals and to said fourth signals for detecting the envelopes of each of said first amplitude modulated signals.

2. Envelope detecting means as in claim 1 in which said mixer means comprises a double balanced mixer.

3. Envelope detecting means as in claim 1 and further comprising filter means responsive to the output signal of said mixer means to remove higher order signal components resulting from mixing said first and second signals.

* * * * *